United States Patent
Zhang et al.

(12)

(10) Patent No.: US 6,225,035 B1
(45) Date of Patent: May 1, 2001

(54) METHOD FOR FORMING A THICK-FILM RESISTOR

(75) Inventors: Min-xian Zhang, Algonquin; Vernon L. Brown, Barrington, both of IL (US); George E. White, Marrietta, GA (US); Lola Conway, Elgin, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/040,635

(22) Filed: Mar. 18, 1998

(51) Int. Cl.$^7$ .................................................. G03F 7/40
(52) U.S. Cl. ..................... 430/330; 430/312; 430/313; 430/315; 430/324; 427/96
(58) Field of Search .................................... 430/312, 313, 430/315, 324, 330; 427/96

(56) References Cited

U.S. PATENT DOCUMENTS

| | | | |
|---|---|---|---|
| 4,479,890 | * 10/1984 | Prabhu et al. | 252/508 |
| 4,610,810 | * 9/1986 | Hasegawa | 252/511 |
| 4,870,746 | * 10/1989 | Klaser | 29/620 |
| 5,162,144 | 11/1992 | Brown et al. | 428/209 |
| 5,260,170 | 11/1993 | Brown | 430/315 |
| 5,338,567 | 8/1994 | Kohn | 427/98 |
| 5,347,258 | 9/1994 | Howard et al. | 338/333 |
| 5,792,594 | * 8/1998 | Brown et al. | 430/315 |

FOREIGN PATENT DOCUMENTS

2666682 A1 * 3/1992 (FR).

\* cited by examiner

Primary Examiner—Mark F. Huff
Assistant Examiner—Nicole Barreca
(74) Attorney, Agent, or Firm—Douglas D. Fekete

(57) ABSTRACT

A process for forming a resistor whose dimensions can be accurately determined by a photoimaging process, thereby yielding a resistor whose size and resistance value render the resistor a viable alternative to discrete chip resistors. The resistor is formed of a photoimageable resistive thick-film material that enables the dimensions of a resistor to be determined directly by photodefinition instead of conventional screen printing. Electrically-conductive terminations are provided that determine the electrical length of the resistor. The terminations may be formed prior to depositing the resistive layer, or after the resistive layer has been photoimaged and developed. If the latter approach is used, the terminations may be formed by depositing a photoimageable layer on the resistor, photoimaging and developing the photoimageable layer so as to form openings that expose regions of the resistor, and then plating, e.g., electrolessly plating, a conductive material on the exposed regions of the resistor to form terminations that overlie the resistor. Alternatively, by formulating the photoimageable layer to be plateable, a second photoimageable layer can be deposited on the plateable photoimageable layer prior to plating the conductive material, and then photoimaged and developed to form openings that expose regions of the plateable photoimageable layer that are adjacent the regions of the resistor exposed by the openings in the plateable photoimageable layer. Thereafter, the conductive material can be plated on the regions of the resistor and the plateable photoimageable layer exposed by the openings to yield terminations and connectors to the resistor.

5 Claims, 5 Drawing Sheets

METHOD FOR FORMING A THICK-FILM RESISTOR

This invention was made with Government support under Agreement No. F33615-96-2-1838 awarded by DARPA. The Government has certain rights in the invention.

FIELD OF THE INVENTION

The present invention generally relates to the manufacturing of printed circuit boards (PCB) and printed circuit assemblies (PCA). More particularly, this invention relates to a method for forming a thick-film resistor on a PCB with photolithographic or photoimaging techniques.

BACKGROUND OF THE INVENTION

Discrete resistors that require mounting directly to the surface of a circuit board are widely used in the electronics industry. A disadvantage with discrete resistors is the additional weight, assembly complexity and reduced circuit density that are incurred with their use. While the size of discrete resistors has been considerably reduced, with chip resistors commercially available having dimensions of as little as about 20×40 mils (about 0.5×1 millimeter), further miniaturization can generally be cost prohibitive for boards requiring numerous resistors.

Thick-film resistors are available alternatives to the use of discrete resistors. However, thick-film resistors have limited applications because of the size and tolerance control of the printing process used to form such resistors, which generally entails screen printing a thick-film resistive paste or ink on a substrate, such as a printed circuit board (PCB), flexible circuit, or a ceramic or silicon substrate. Thick-film inks are typically composed of an electrically-resistive material dispersed in an organic vehicle or polymer matrix material. After printing, the thick-film ink is typically heated to convert the ink into a suitable film that adheres to the substrate. If a polymer thick-film ink is used, the heating step serves to dry and cure the polymer matrix material. Other thick-film inks must be sintered, or fired, during which the ink is heated to burn off the organic vehicle and fuse the remaining solid material.

In addition to the size and tolerance limitations noted above, the use of a thick-film resistor is further complicated by the predictability and variability (or tolerance) of the electrical resistance, which are dependent on the precision with which the resistor is produced, the stability of the resistor material, and the stability of the resistor terminations. Conventional thick-film resistors are rectangular shaped, with "x," "y" and "Z" dimensions corresponding to the electrical width (W), electrical length (L) and thickness, respectively, of the resistor. Control of the "x" and "y" dimensions of a thick-film resistor is particularly challenging in view of the techniques employed to print thick-film inks and the dimensional changes that may occur during subsequent processing. For rectangular screen-printed resistors, the x and z dimensions are determined by the resistor screening process, and the y dimension is determined by the termination pattern. Conventional screen printing techniques generally employ a template with apertures bearing the positive image of the resistor to be created. The template, referred to as a screening mask, is placed above and in close proximity to the surface of the substrate on which the resistor is to be formed. The mask is then loaded with the resistive ink, and a squeegee blade is drawn across the surface of the mask to press the ink through the apertures and onto the surface of the substrate.

Compared to many other deposition processes, screen printing is a relatively imprecise process. Screen printed thick-film resistors having adequate tolerances in the x and y dimensions are often larger than chip resistors. Resistance value predictability is generally low, and precise tolerances typically cannot be maintained at aspect ratios (L/W) below 0.5 squares. As a result, one ink of a given resistivity, requiring one screening, cure and associated process steps, is required for each decade of resistance value needed in a circuit design, which often necessitates the use of three to four inks to complete one circuit. While resistance tolerances can be improved by laser trimming, such an operation is usually cost-prohibitive for complex circuits. As a result, screen printed thick-film resistors have found only limited application as a substitute for discrete resistors.

Accordingly, a need exists for a method for fabricating a thick-film resistor having more precise dimensional tolerances and a wider range of readily-producible resistances per single resistive ink than present thick-film resistors offer.

SUMMARY OF THE INVENTION

The present invention provides a process for forming a resistor whose dimensions can be accurately determined by photoimaging processes, thereby yielding a resistor whose size can be sufficiently small and whose resistance value can be sufficiently predicted to be a commercially viable alternative to discrete chip resistors. More particularly, resistors of this invention are formed of a photoimageable resistive thick-film material that enables the dimensions of the resistor to be determined directly by photodefinition instead of conventional screen printing. As a result, the dimensions of a resistor formed in accordance with this invention can be more precisely determined than possible for prior art screen printed thick-film resistors. Moreover, resistors of this invention can be formed and sized to maximize the circuit density on a circuit board while incurring minimal additional weight.

The method of this invention generally entails depositing a photoimageable electrically-resistive layer on a substrate. Suitable materials for the resistive layer preferably contain an electrically-conductive particulate filler in a curable and photoimageable polymeric matrix. Once deposited, the resistive layer is photoimaged and developed so as to remove a portion of the layer while the remaining portion remains to define a resistor on the substrate. Electrically-conductive terminations are provided that determine the electrical length of the resistor.

The terminations may be formed on the substrate prior to depositing the resistive layer, such as by electroplating, or after the resistive layer has been photoimaged and developed. If the latter approach is used, the material for the photoimageable electrically-resistive layer is further modified to render the resistive layer plateable. The terminations can then be formed by depositing a photoimageable layer on the resistor, photoimaging and developing the photoimageable layer so as to form openings that expose two regions of the resistor. The exposed regions of the resistor, associated with the developed photoimageable layer, is then plated with a conductive material to form terminations that overlie the resistor. In an alternative embodiment, a plateable photoimageable layer is deposited and photoimaged in the manner described above, after which a second photoimageable layer is deposited on the plateable photoimageable layer prior to developing the plateable photoimageable layer. The second photoimageable layer is then photoimaged and the photoimageable layers developed simultaneously to form openings that expose two regions of the resistor and two regions of the plateable photoimageable layer that are adjacent the exposed regions of the resistor. Thereafter, the conductive material can be plated on the exposed regions of the resistor and the plateable photoimageable layer to yield terminations and connectors to the resistor.

From the above, those skilled in the art will appreciate that forming a thick-film resistor from a photoimageable material in accordance with this invention enables the electrical width of the resistor to be precisely determined by photoimaging, while the electrical length of the resistor can be precisely determined by the process used to form the terminations. The result is a thick-film resistor whose dimensions can be controlled far better than possible by screen printing, and whose size can be less than that of discrete resistors.

DETAILED DESCRIPTION OF THE PREFERRED EMBODIMENT

The processes described and represented in the Figures achieve the advantageous features of this invention in reference to forming precision thick-film resistors using a photosensitive or photoimageable thick-film resistive ink. While particular resistor configurations are shown in the Figures, those skilled in the art will appreciate that numerous variations and modifications are possible, and such variations and modifications are within the scope of this invention.

Figure 1A:
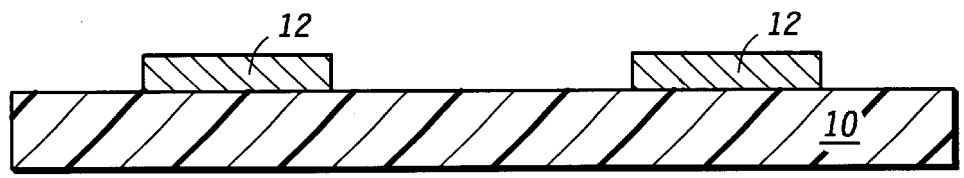
FIGS. 1A through 1D illustrate processing steps for a first example of the method for forming a thick-film resistor.

Referring to Figure 1A, a substrate 10 is shown on which a pair of conductive connectors 12 have been formed. The substrate 10 can be any suitable material, including a printed circuit board (PCB), a flexible circuit, a ceramic or silicon substrate, or any dielectric layer of a multilayer circuit, though other suitable substrates and materials could also be used. The connectors 12 are preferably copper layers formed by known methods such as fully additive plating, pattern plating, panel plating, or foil lamination followed by subtractive etching. Panel plating generally entails electrolessly plating copper and electroplating the resulting copper flash. A copper layer thus formed, or a conductive foil laminated to the substrate 10, can then be patterned by applying and patterning a photoresist and etching the metal. A suitable pattern plating technique is to electrolessly plate copper, electroplate the resulting copper flash through a plating resist that has been appropriately patterned. The resist is then stripped and quick-etched to remove the electroless flash that was not plated.

Figure 1B:
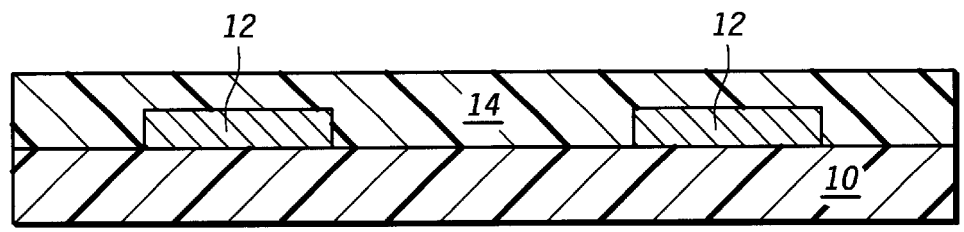

FIG. 1B shows a resistive layer 14 that has been deposited on the substrate 10 and over the connectors 12. In accordance with this invention, the resistive layer 14 is formed by a photosensitive or photoimageable polymer thick-film material containing a sufficient amount of a conductive material to enable the resistive layer 14 to exhibit suitable resistivity. Requirements of the thick-film material further include the following: (a) photodefinability with adequate resolution; (b) processing temperatures preferably below about 200 degrees Celsius to be compatible with typical PCB processes; and (c) compatibility with subsequent additive processing to enable the resistor to be embedded in the PCB. The present invention entailed the development of a material having each of the above characteristics. A suitable material developed for the resistive layer 14 contains a photosensitive resin in which a carbon black powder has been dispersed. Suitable compositions for the resin include photosensitive polymers available from Ciba-Geigy in the Probimer 61 series of resins developed as solder mask materials, with preferred composition versions of this series being those without inorganic fillers, such as LMB 4959. However, it is foreseeable that other photosensitive resins could be used. The carbon black powder used during the evaluation of this invention was XE2 available from the Degussa Corporation, which is preferred for having a very high structure (i.e., a high surface-to-volume ratio), such that less carbon black powder is required to achieve the same resistivity for the resistive layer 14. The relative amounts of powder and resin used to form the resistive material must be necessarily controlled to achieve the desired sheet resistivity while also being sufficiently translucent in order to ensure the polymer within the resistive layer 14 undergoes sufficient cross-linking or curing to enable proper development of the resistive layer 14. According to this invention, preferred ratios for the conductive powder and polymer matrix are about 1:10 to about 1:20 on a cured volume basis.

Figure 1C:
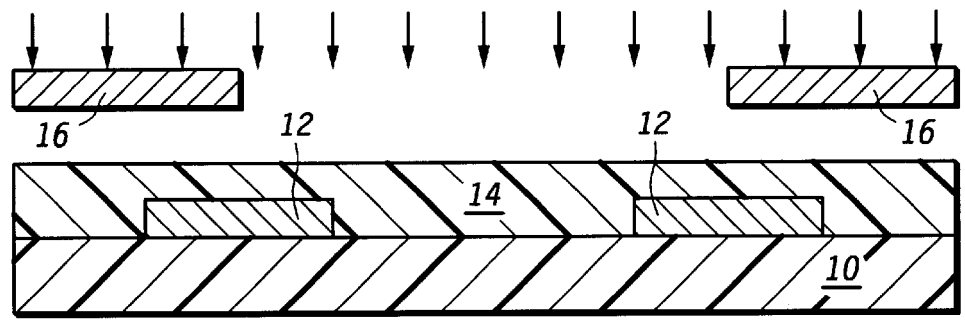

Once deposited by a suitable coating method such as curtain coating to achieve a cured thickness of about 5 to 10 microns, the resistive layer 14 is dried and then photoimaged through a suitable photomask 16 as shown in FIG. 1C. The LMB 4959 is formulated to be photodefined with ultraviolet (UV) energy. In practice, a suitable power level for the UV exposure is about 4500 mJ/cm$^2$. Thereafter, the resistive layer 14 is precured at a temperature and for a duration sufficient for further cross-linking in the exposed area, such as heating at about 125 degrees Celsius for about ten minutes. The resistive layer 14 is then developed to yield the resistor 20 shown in FIG. 1D. A suitable developer is gamma-butyrolactone (GBL), a well known and commercially available solvent. Finally, the resistor 20 is cured. Using the LMB 4959 resin as the matrix material for the resistive layer 14, a suitable cure process is heating at about 125 degrees Celsius for about one hour, though it is foreseeable that different temperatures and durations could be suitable, particularly if different materials are used for the resistive material.

Figure 1D:
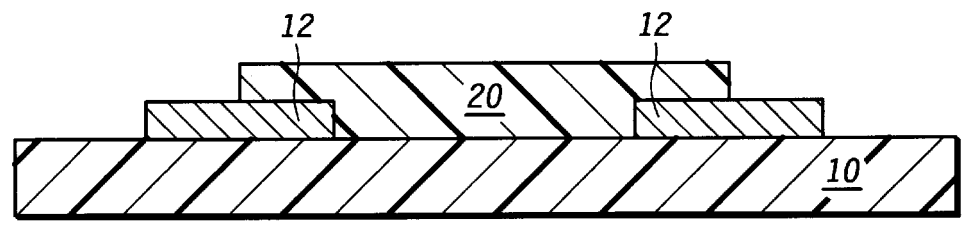

The resistor 20 shown in FIG. 1D is able to exhibit highly predictable resistance as a result of the precise dimensions achievable while photodefining the resistor 20 and forming the connectors 12. Resistors formed in accordance with the above method have exhibited sheet resistivities of about 20 kilo-ohms/square and are characterized by satisfactory resolution at line widths of as little as one mil (about 25 micrometers).

Figure 2A:
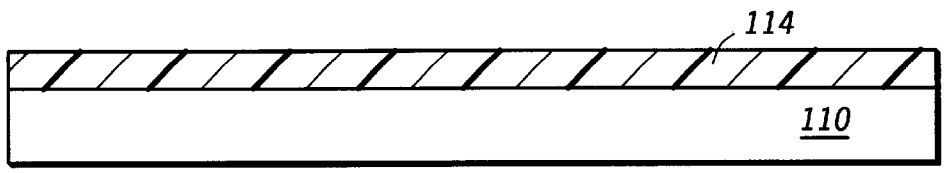
FIGS. 2A through 2G illustrate processing steps for a second example of the method for forming a thick-film resistor.

FIGS. 2A–2G represent the processing steps in accordance with a second embodiment of this invention, in which electrically-conductive connectors 128 to a photodefined thick-film resistor overlie the resistor, instead of underlying the resistor as shown in FIG. 1D. In FIG. 2A, a substrate 110 is shown as being coated (e.g., curtain coated) with a photoimageable polymer thick-film material to yield a resistive layer 114. In accordance with this embodiment of the invention, the resistive layer 114 differs from the resistive layer 14 of FIGS. 1A through 1D by further being electrolessly plateable. For this purpose, the thick-film material used to form the resistive layer 114 contains an electrically-conductive particulate material and a catalytic material dispersed in a photoimageable polymer matrix, the latter of which enables a resistor (resistor 120 of FIG. 2C) formed from the resistive layer to be electrolessly plateable. Suitable materials for the conductive material and polymer matrix are the carbon black powder and photosensitive resin noted for the previous embodiment. A suitable catalytic material is a metal oxide powder that constitutes about one to about two volume percent of the resistive material. A preferred metal oxide is cuprous oxide, though it is foreseeable other oxides or catalytic fillers could be used. To improve particle dispersion in the resin, both the carbon black powder and the cuprous oxide particles are preferably surface-treated with a coupling agent such as Ken-React KR-55, available from Kenrich Petrochemicals, Inc., of Bayonne, N.J. Alternatively, the carbon black powder could be admixed with a catalyzed resin disclosed in U.S. Pat. No. 5,162,144 to Brown et al., assigned to the same assignee as the present application and hereby incorporated by reference. It is foreseeable that other conductive, catalytic and photodefinable materials could be used to form the resistive layer 114 of this embodiment.

As with the embodiment of FIGS. 1A through 1D, the relative amounts of conductive powder, catalytic powder and resin used to form the resistive layer 114 must be necessarily controlled to achieve the desired sheet resistivity, photoimageability, and catalytic activity. According to this invention, suitable constituent ranges for the cured plateable photoimageable resistive material of this invention are about five to about ten volume percent carbon black powder, about one to about two volume percent catalytic powder, and about eighty-eight to about ninety-four volume percent resin. A preferred ratio for the conductive powder, catalytic powder and polymer matrix is about 7.5:1.5:91, respectively, on a cured volume basis.

Figure 2B:
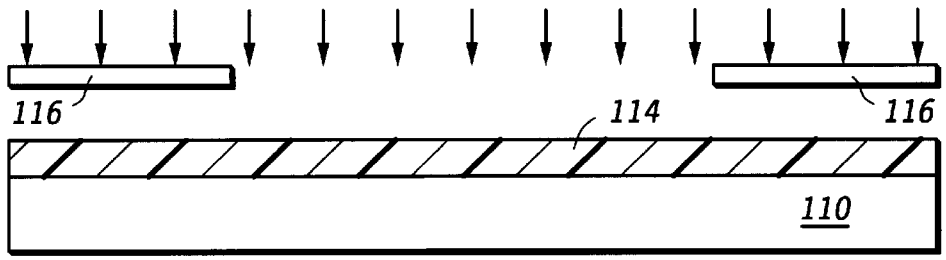
Figure 2C:
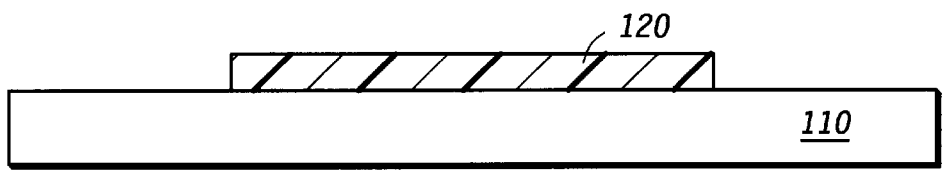
Figure 2D:
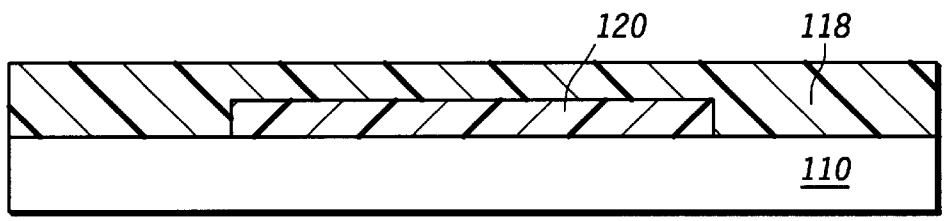

FIG. 2B is analogous to FIG. 1C, and shows the resistive layer 114 being photodefined by UV energy through a photomask 116 similar to that shown in FIG. 1C. Similarly, FIG. 2C is analogous to FIG. 1D, and shows the result of developing the resistive layer 114 with a suitable developer (e.g., GBL) to yield a thick-film resistor 120. As before, the ability to directly photodefine the resistive layer 114 enables the resistor 120 to have precise dimensions. Thereafter, the embodiment of FIGS. 2A through 2G differs from that of FIGS. 1A through 1D as follows. FIG. 2D shows a photoimageable layer 118 deposited on the substrate 110 and over the resistor 120. Preferred materials for the photoimageable layer 118 are those that enable known photoimaging and development techniques to be employed to pattern the openings in the layer 118, and following development enable the photoimageable layer 118 to remain on the substrate 110 as a permanent dielectric layer. Materials that meet these criteria typically contain a resin, photosensitive agents and hardeners. The resin component can be any suitable liquid resin or solid resin, so as to enable the resin mixture to be readily deposited onto the surface of the substrate 110 in liquid form or as a laminate to form the layer 118. Resins that could be used include thermoplastic resins, thermosetting resins, elastomers and mixtures thereof, which when incorporated with a photosensitive material yield a photodefinable composition. Desirable properties for the polymer, which forms the photoimageable layer 118, include dielectric and physical properties that remain stable throughout deposition and photoimaging of the photoimageable layer 118.

Figure 2E:
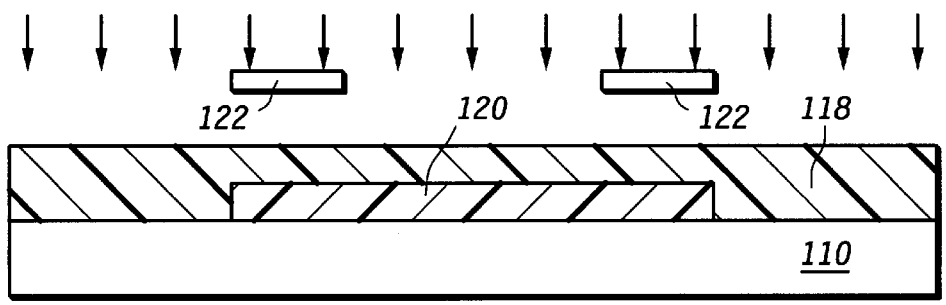
Figure 2F:
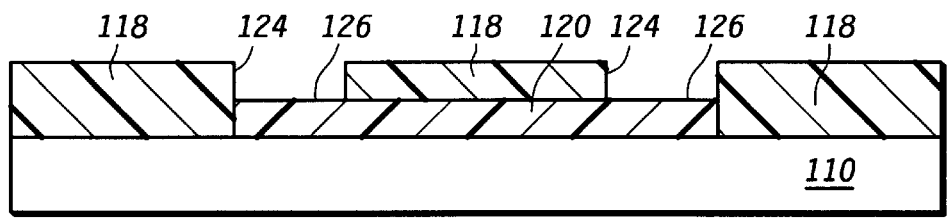
Figure 2G:
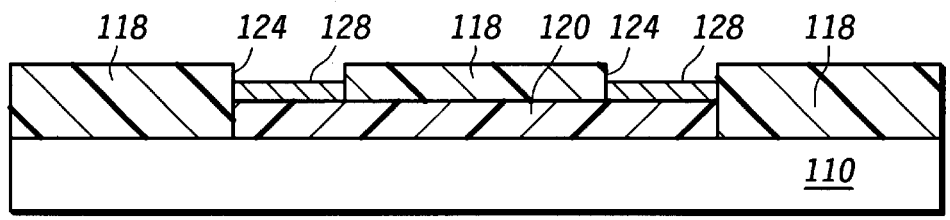

FIG. 2E shows a second photoimaging step in which the photoimageable layer 118 is photodefined with a second photomask 122, and FIG. 2F shows openings 124 developed in the photoimageable layer 118 as a result of photoimaging and treatment with a suitable solvent that illustratively attacks the surface regions of the photoimageable layer 118 that were not exposed to UV light by the pattern in the photomask 122. Importantly, the openings 124 expose surface regions 126 of the resistor 120, which can then be plated as shown in FIG. 2G to produce conductive connectors 128 to the resistor 120. Again, direct electroless plating of the resistor 120 is enabled by the above-described resistive material, which is preferably used for the resistive layer 114. Consequently, the ability to directly plate the resistor 120 through photoimaged openings 124 enables the electrical length of the resistor 120 to be precisely established. Additional circuit layers may be deposited on the structure shown in FIG. 2G to fully embed the thick-film resistor 120.

Finally, FIGS. 3A through 3I represent processing steps in accordance with a third embodiment of this invention, in which electrically-conductive connectors to the thick-film resistor are again formed to overlie the resistor. The initial processing steps shown in FIGS. 3A through 3E are analogous to FIGS. 2A through 2E, showing an electrolessly-plateable photoimageable resistive layer 214 deposited on a substrate 210 and then developed through a photomask 216 to produce a photodefined electrolessly-plateable resistor 220, over which a dielectric and photoimageable layer 218 is formed and photoimaged through a second photomask 222. An important difference is the photoimageable layer 218 is also electrolessly plateable. For this purpose, the material used to form the photoimageable layer 218 includes a catalytic material dispersed in a photoimageable polymer matrix. As with the resistive material for the resistive layers 114 and 214, a suitable material for the polymer matrix is a photosensitive resin such as LMB 4959, with suitable catalytic additives being metal oxide (e.g., cuprous oxide) particles that constitute about two to about three weight percent of the photoimageable material. It is foreseeable that other catalytic and photodefinable compositions could be used to form the photoimageable layer 218, such as the previously-noted catalyzed resin disclosed in U.S. Pat. No. 5,162,144 to Brown et al.

Figure 3A:
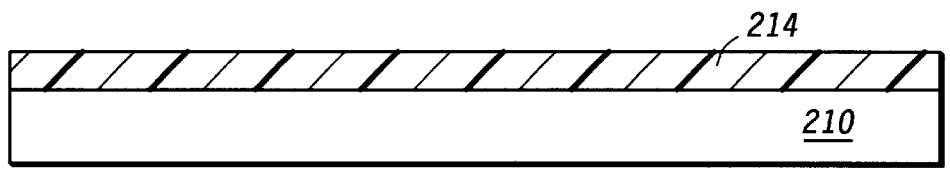
FIGS. 3A through 3I illustrate processing steps for a third example of the method for forming a thick-film resistor.
Figure 3B:
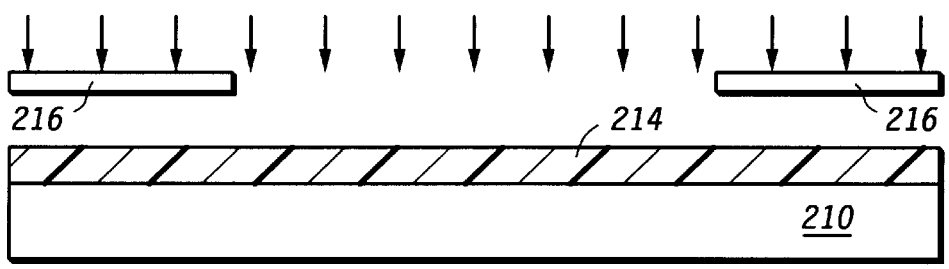
Figure 3C:
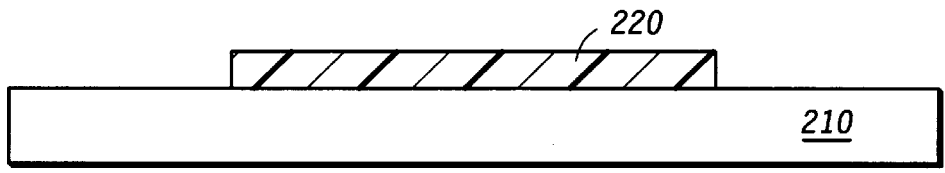
Figure 3D:
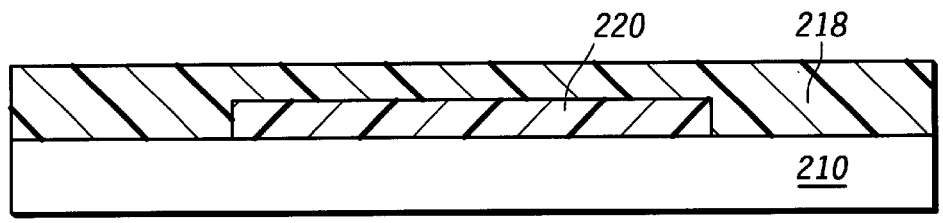
Figure 3E:
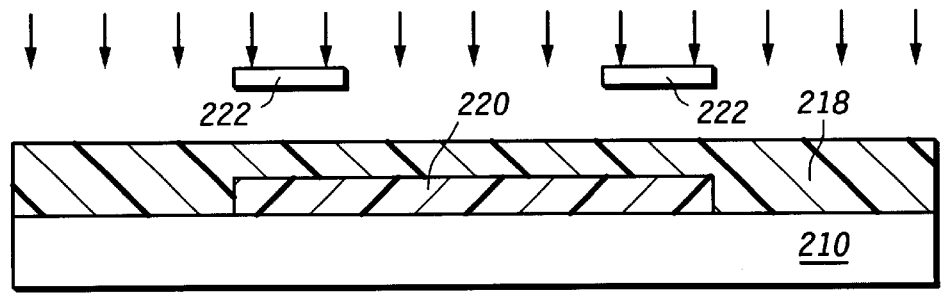
Figure 3F:
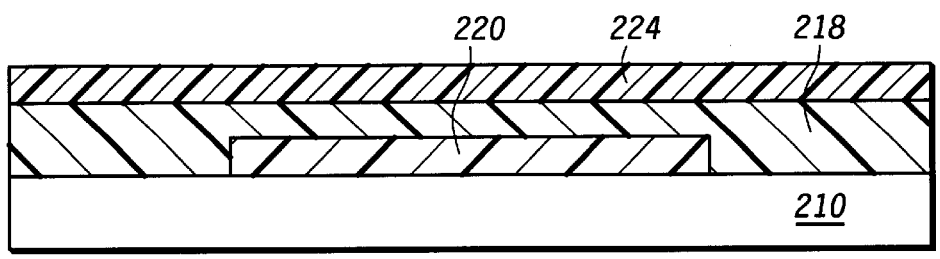
Figure 3G:
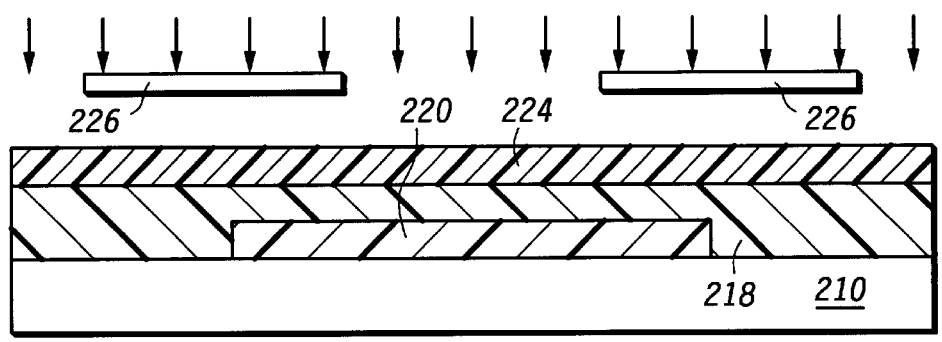
Figure 3H:
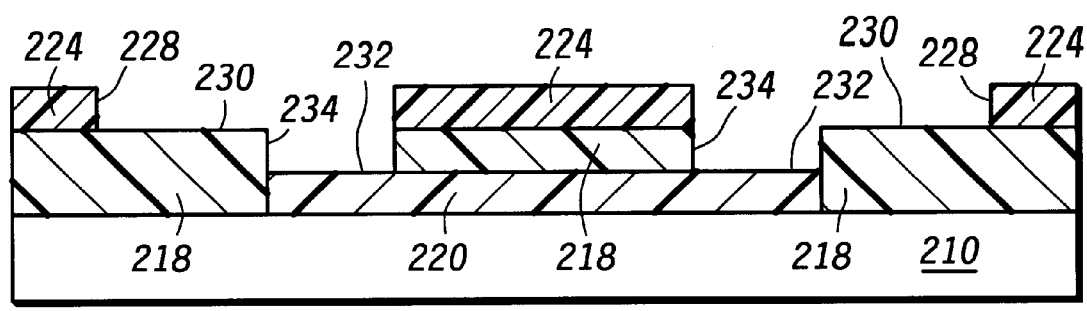
Figure 3I:
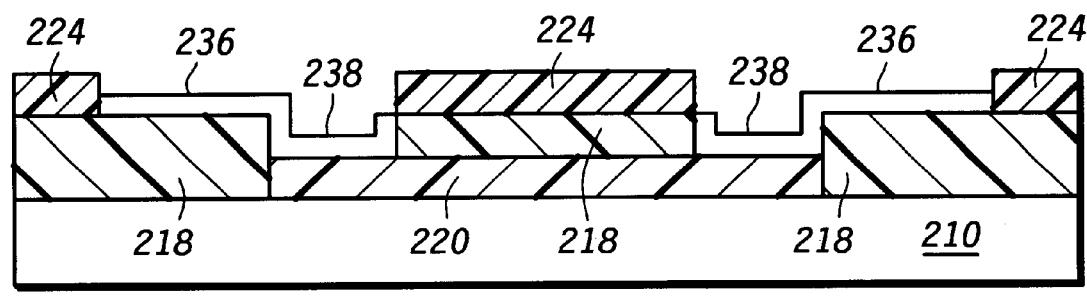

The embodiment of FIGS. 3A through 3I further differs from that of FIGS. 2A through 2G by the use of a second photoimageable layer 224, which is preferably deposited prior to developing the photoimageable layer 218, though it is within the scope of this invention to develop the photoimageable layer 218 prior to forming the photoimageable layer 224. Suitable materials for the photoimageable layer 224 include those noted previously for the photoimageable layer 118 of the prior embodiment of FIGS. 2A through 2G. FIG. 3G shows a third photoimaging step in which the photoimageable layer 224 is photoimaged with a third photomask 226, after which both photoimageable layers 218 and 224 are developed as shown in FIG. 3H. Openings formed by developing the photoimageable layers 218 and 224 include a pair of openings 228 in the photoimageable layer 224 which expose a surface region 230 of the photoimageable layer 218, and a pair of openings 234 in the photoimageable layer 218 that expose surface regions 232 of the resistor 220. The electrolessly-plateable photoimageable layer 218 and resistor 220 are then plated as shown in FIG. 3I to produce conductive connectors 238 and connections 236 to the resistor 220, with the plated walls of the opening 234 in the photoimageable layer 218 effectively yielding vias for interconnection between the connections and connectors 236 and 238. Again, the ability to directly plate the resistor 220 through photoimaged openings 234 enables the electrical length of the resistor 220 to be precisely established. Additional circuit layers may then be deposited on the structure shown in FIG. 3I to fully embed the thick-film resistor 220 of this invention.

From the above, those skilled in the art will appreciate that resistors formed in accordance with any of the above embodiments or illustrative methods of this invention are characterized by precise dimensions, and therefore highly predictable resistance values, as a result of the photoimaging processes employed. The photodefined thick-film resistors of this invention can be readily produced to have dimensions that are controlled far better than that possible by screen printing, and whose size can be less than that of discrete resistors, e.g., on the order of about 0.5×0.5 millimeters and less.

While our invention has been described in terms of particular embodiments, it is apparent that other forms could be adopted by one skilled in the art. For example, certain processing parameters could be modified, appropriate materials could be substituted, or the process of this invention could be employed for different applications or other processes. Accordingly, the scope of our invention is to be limited only by the following claims.

What is claimed is:

1. A method for forming a resistor, the method comprising the steps of:

depositing a photoimageable electrically-resistive layer on a substrate, the electrically-resistive layer comprising a carbon black powder in a curable polymeric matrix, the carbon black powder being combined with the curable polymeric matrix in a ratio of about 1:10 to about 1:20 on a volume basis;

photoimaging and developing the electrically-resistive layer so as to remove a first portion of the electrically-resistive layer and leave a second portion of the electrically-resistive layer on the substrate;

heating the second portion of the electrically-resistive layer so as to cure the polymeric matrix and form a thick-film resistor on the substrate; and providing electrically-conductive terminations that determine the electrical length of the thick-film resistor.

2. A method as recited in claim 1, wherein the terminations are formed on the substrate prior to the depositing step, and the electrically-resistive layer does not contain inorganic fillers.

3. A method as recited in claim 1, wherein the curable polymeric matrix is a photosensitive resin matrix and the electrically-resistive layer comprises about eighty-eight to about ninety-four volume percent of the photosensitive resin matrix, about five to about ten volume percent of the carbon black powder and about one to about two volume percent of a catalytic filler that enables the electrically-resistive layer to be electrolessly plated.

4. A method as recited in claim 3, wherein the terminations are formed on the thick-film resistor after the heating step by:

depositing a photoimageable layer on the resistor;

photoimaging and developing the photoimageable layer so as to form openings in the photoimageable layer that expose at least two regions of the resistor; and then electrolessly plating a conductive material on the two regions of the resistor.

5. A method as recited in claim 3, wherein the terminations are formed on the thick-film resistor after the heating step by:

depositing a first photoimageable dielectric layer on the resistor;

photoimaging the first photoimageable dielectric layer;

depositing a second photoimageable dielectric layer on the first photoimageable dielectric layer;

photoimaging the second photoimageable dielectric layer;

developing the first and second photoimageable dielectric layers so as to form openings therein, the openings exposing at least two regions of the resistor and at least two adjacent regions of the first photoimageable dielectric layer; and then electrolessly plating a conductive material on the two regions of the resistor and the two adjacent regions of the first photodefinable dielectric layer.

* * * * *